(12) United States Patent
Yasutake et al.

(10) Patent No.: US 11,839,893 B2
(45) Date of Patent: Dec. 12, 2023

(54) SUBSTRATE PROCESSING APPARATUS

(71) Applicant: SCREEN Holdings Co., Ltd., Kyoto (JP)

(72) Inventors: Yosuke Yasutake, Kyoto (JP); Hiroaki Ishii, Kyoto (JP); Wataru Sakai, Kyoto (JP); Yutaka Ikegami, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 17/787,229

(22) PCT Filed: Dec. 16, 2020

(86) PCT No.: PCT/JP2020/046979
§ 371 (c)(1),
(2) Date: Jun. 17, 2022

(87) PCT Pub. No.: WO2021/131972
PCT Pub. Date: Jul. 1, 2021

(65) Prior Publication Data
US 2022/0388020 A1    Dec. 8, 2022

(30) Foreign Application Priority Data
Dec. 25, 2019    (JP) .................................. 2019-233844

(51) Int. Cl.
*B05C 5/02*    (2006.01)
*B05B 13/04*    (2006.01)
(Continued)

(52) U.S. Cl.
CPC ...... *B05B 13/0442* (2013.01); *B05B 13/0278* (2013.01); *B05C 5/02* (2013.01); *B05C 11/00* (2013.01); *H01L 21/6715* (2013.01)

(58) Field of Classification Search
None
See application file for complete search history.

(56) References Cited

U.S. PATENT DOCUMENTS 10,639,683 B2    5/2020 Tsuchihashi et al.
2006/0233952 A1    10/2006 Nakashima et al.
(Continued)

FOREIGN PATENT DOCUMENTS

JP    2006-302934 A    11/2006
JP    2012-232298 A    11/2012
(Continued)

OTHER PUBLICATIONS

English translation of JP 2015046522).*
(Continued)

*Primary Examiner* — Charles Capozzi
(74) *Attorney, Agent, or Firm* — OSTROLENK FABER LLP

(57) ABSTRACT

A holding mechanism holds a substrate horizontally. A rotation mechanism rotates the holding mechanism holding the substrate. A nozzle supplies a processing liquid to the substrate. A nozzle arm holds the nozzle. An arm actuation mechanism moves the nozzle arm between a processing position overlapping the substrate in plan view and a retracted position displaced from the substrate in plan view. A cup portion is disposed around the holding mechanism, and receives the processing liquid from the substrate. A cup actuation mechanism moves the cup portion up and down between an upper position and a lower position. A first container is fixed to the cup portion to be movable up and down integrally with the cup portion, and can accommodate the nozzle at the retracted position.

6 Claims, 17 Drawing Sheets

(51) Int. Cl.
  *B05B 13/02* (2006.01)
  *B05C 11/00* (2006.01)
  *H01L 21/67* (2006.01)

(56) References Cited

U.S. PATENT DOCUMENTS

| | | | | |
|---|---|---|---|---|
| 2011/0240601 | A1* | 10/2011 | Hashizume | ....... H01L 21/67051 156/345.23 |
| 2015/0020852 | A1 | 1/2015 | Kato et al. | |
| 2018/0078973 | A1 | 3/2018 | Yano et al. | |

FOREIGN PATENT DOCUMENTS

| | | | |
|---|---|---|---|
| JP | 2015-023048 | A | 2/2015 |
| JP | 2015-046522 | A | 3/2015 |
| JP | 2018-049909 | A | 3/2018 |
| JP | 2018-107397 | A | 7/2018 |
| JP | 2018-133429 | A | 8/2018 |
| JP | 2018-142694 | A | 9/2018 |
| JP | 2019-029492 | A | 2/2019 |
| TW | I668060 | B | 8/2019 |

OTHER PUBLICATIONS

International Search Report dated Mar. 16, 2021 in corresponding PCT International Application No. PCT/JP2020/046979.
Written Opinion dated Mar. 16, 2021 in corresponding PCT International Application No. PCT/JP2020/046979.
Office Action and Search Report dated Jun. 29, 2021 in counterpart Taiwanese Patent Application No. 109145394 with partial English translation based on the Japanese translation of the original communication.
Decision of Refusal dated Nov. 30, 2021 in counterpart Taiwanese Patent Application No. 109145394 with partial English translation based on the Japanese translation of the original communication.
International Preliminary Report on Patentability and Written Opinion dated Jul. 7, 2022 in corresponding International Application No. PCT/JP2020/046979 with English translation.
Notice of Reasons for Refusal dated May 16, 2023 in corresponding Japanese Patent Application No. 2019-233844 and a computer generated English translation obtained from the JPO.
Request for the Submission of an Opinion dated Sep. 12, 2023 in counterpart Korean Patent Application No. 10-2022-7021313 and English language translation obtained from One Portal Dossier.

* cited by examiner

F I G 1
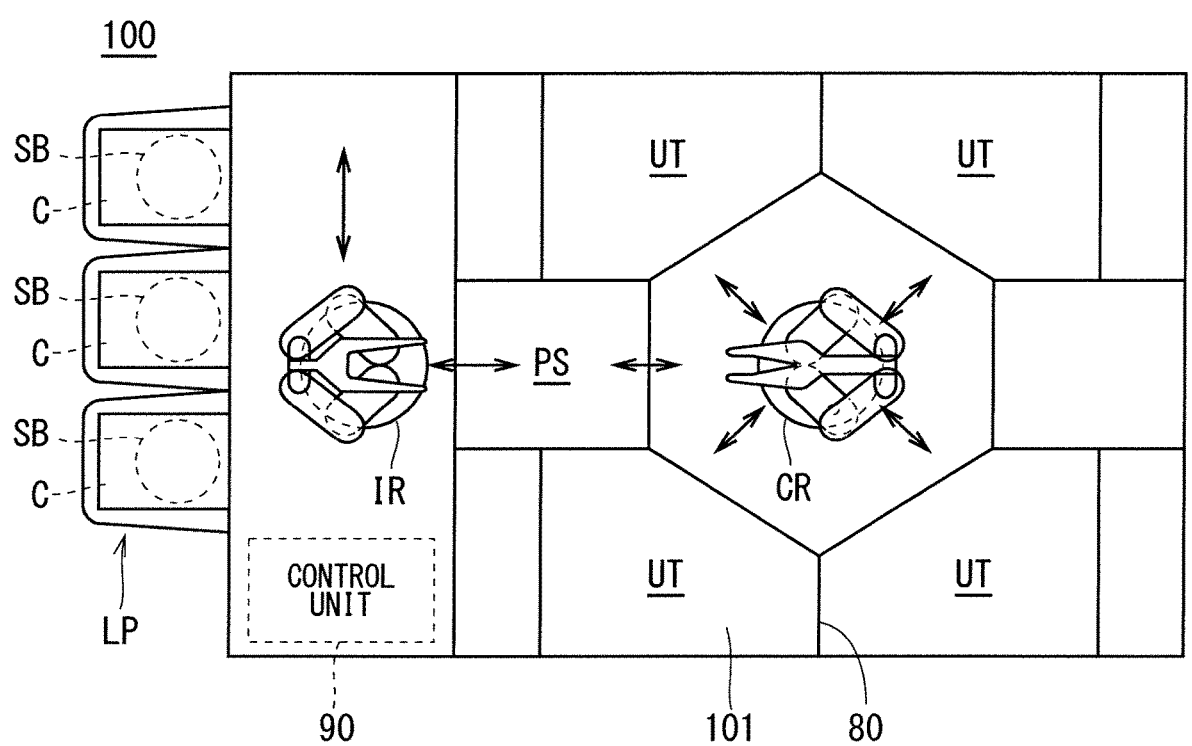

F I G. 3
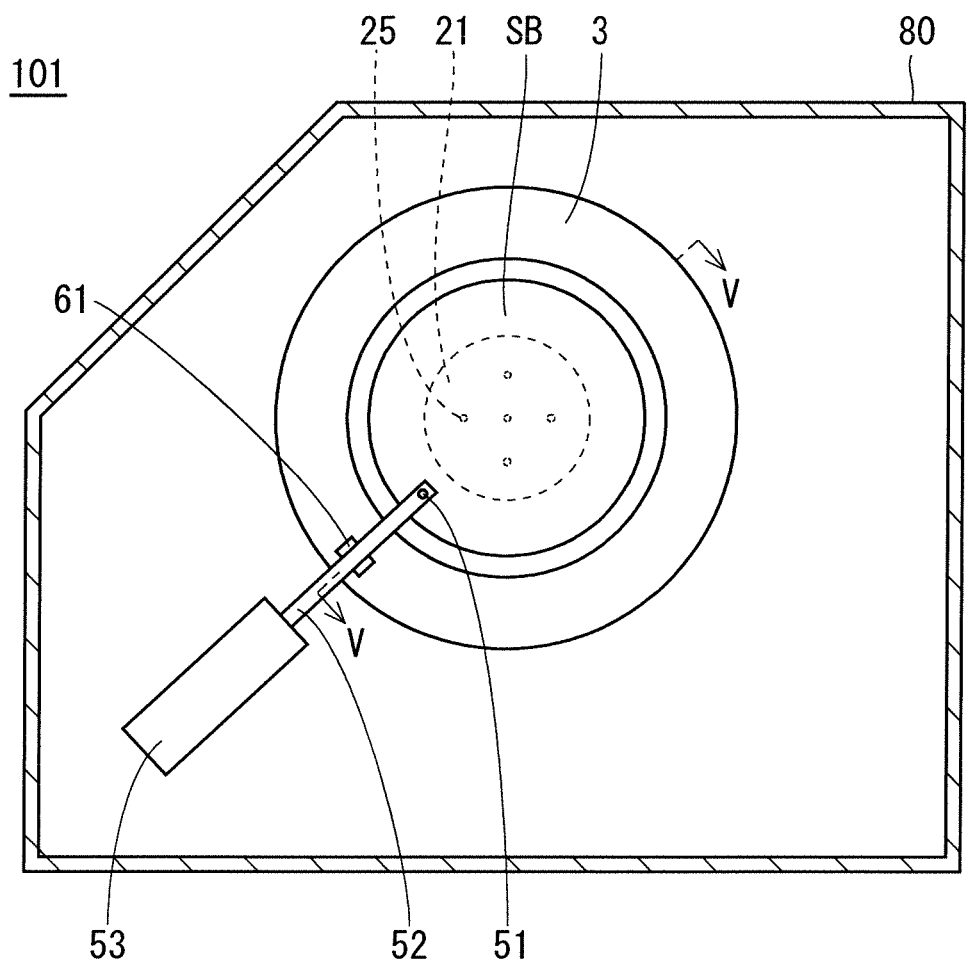

F I G 4
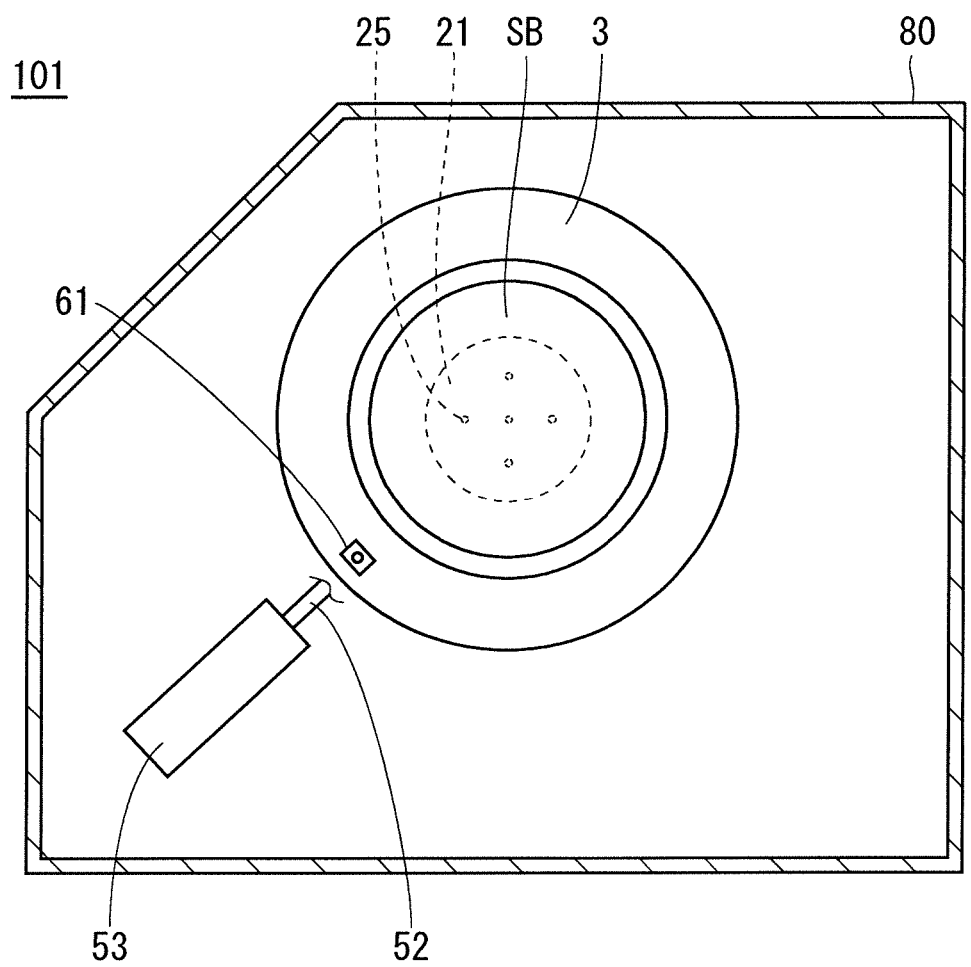

F I G. 6
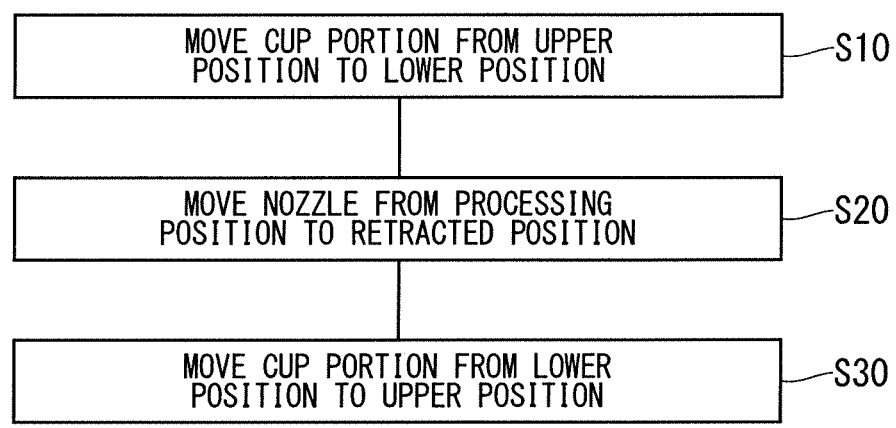

F I G. 7
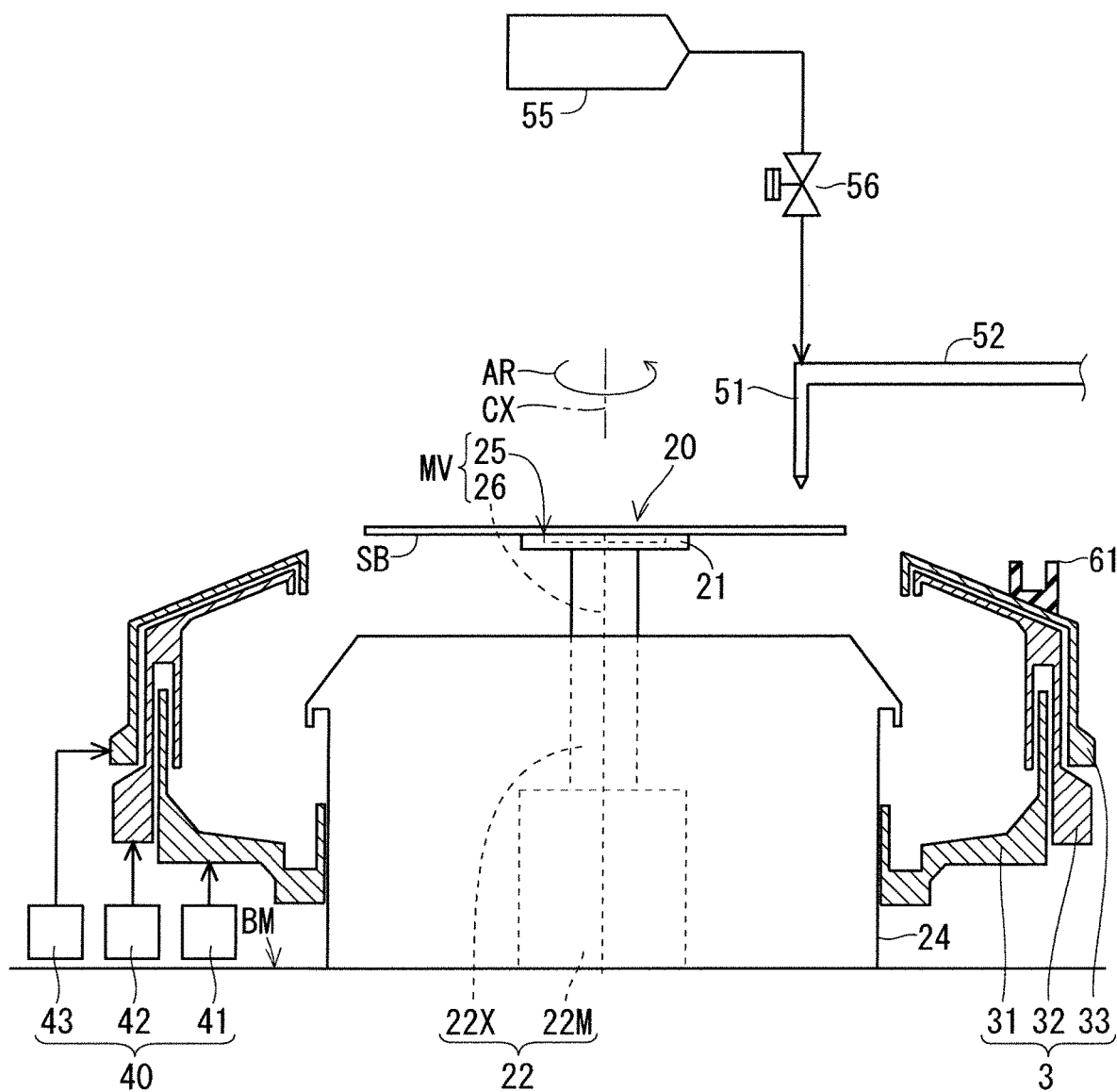

F I G. 1 4
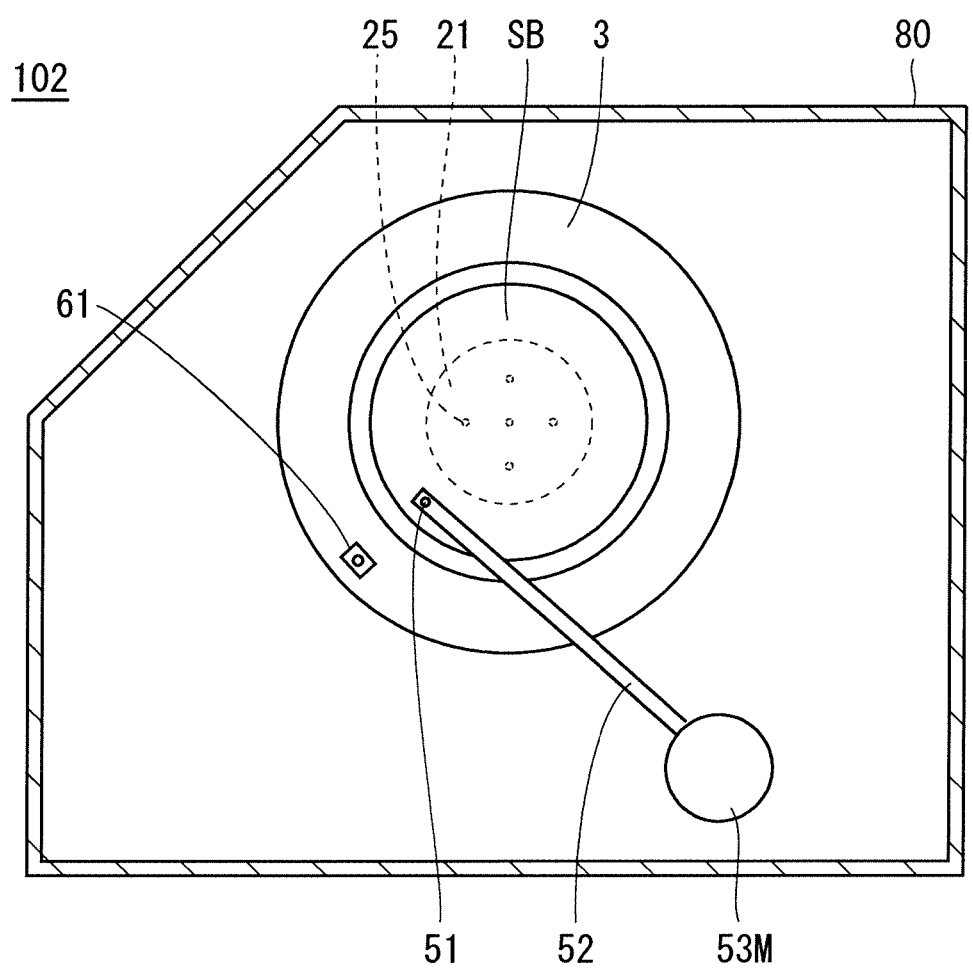

SUBSTRATE PROCESSING APPARATUS

CROSS-REFERENCE TO RELATED APPLICATIONS

The present application is a 35 U.S.C. §§ 371 national phase conversion of International Application No. PCT/JP2020/046979, filed Dec. 16, 2020, which claims priority to Japanese Patent Application No. 2019-233844, filed December 25, the contents of both of which are incorporated herein by reference. The PCT International Application was published in the Japanese language.

TECHNICAL FIELD

The present invention relates to substrate processing apparatuses and, in particular, to a substrate processing apparatus for processing a substrate using a processing liquid. The substrate includes a semiconductor wafer, a glass substrate for a liquid crystal display, a glass substrate for a plasma display, a glass or ceramic substrate for a magnetic or an optical disc, a glass substrate for organic EL, and a glass or silicon substrate for a solar cell.

BACKGROUND ART

Japanese Patent Application Laid-Open No. 2018-107397 (Patent Document 1) discloses a substrate processing apparatus that supplies a processing liquid to a substrate from a processing liquid nozzle moved above the substrate from a standby position. The substrate processing apparatus includes guards that receive the processing liquid scattered around the substrate. Guard raising and lowering drive mechanisms are connected to the guards, and the guards can be raised and lowered in response to a raising and lowering command from a control unit. The substrate processing apparatus further includes a standby pod for allowing the nozzle having moved to the standby position to wait. The standby pod is for allowing the nozzle to wait while the processing liquid is not discharged from the nozzle to the substrate. So-called pre-dispensing processing to preliminarily discharge the processing liquid is performed during waiting. The processing liquid discharged in this case is collected in the standby pod. The standby pod has a container. The container has, in an upper surface thereof, an opening for inserting the tip of the nozzle into the standby pod, and the opening is open with the nozzle being spaced from the standby pod. On the other hand, the opening is closed through insertion of the tip of the nozzle, and the processing liquid discharged from the nozzle can be received in the container.

PRIOR ART DOCUMENT

Patent Document

Patent Document 1: Japanese Patent Application Laid-Open No. 2018-107397

SUMMARY

Problem to be Solved by the Invention

According to technology disclosed in the above-mentioned document, lowering movement of the nozzle is required when the nozzle is inserted into the opening of the container of the standby pod. Such operation, however, is not desirable in some cases. In particular, the above-mentioned lowering movement is impossible in a case where the substrate processing apparatus does not include an actuation mechanism for up and down movement of the nozzle. Even in a case where the substrate processing apparatus includes the actuation mechanism for the up and down movement of the nozzle, operation of the substrate processing apparatus can be cumbersome due to the lowering movement of the nozzle.

The present invention has been conceived to solve a problem as described above, and it is an object of the present invention to provide a substrate processing apparatus not requiring lowering operation of a nozzle when the nozzle is accommodated in a container.

Means to Solve the Problem

A first aspect is a substrate processing apparatus for processing a substrate using a processing liquid including: a holding mechanism that holds the substrate horizontally; a rotation mechanism that rotates the holding mechanism holding the substrate; a nozzle that supplies the processing liquid to the substrate; a nozzle arm that holds the nozzle; an arm actuation mechanism that moves the nozzle arm between a processing position overlapping the substrate in plan view and a retracted position displaced from the substrate in plan view; a cup portion that is disposed around the holding mechanism, and receives the processing liquid from the substrate; a cup actuation mechanism that moves the cup portion up and down between an upper position and a lower position; and a first container that is fixed to the cup portion to be movable up and down integrally with the cup portion, and is capable of accommodating the nozzle at the retracted position.

A second aspect is the substrate processing apparatus according to the first aspect, wherein the first container overlaps the cup portion in plan view.

A third aspect is the substrate processing apparatus according to the first or second aspect, further including a control unit that controls the arm actuation mechanism and the cup actuation mechanism, wherein the control unit has a first control mode in which the cup actuation mechanism is controlled to move the cup portion from the lower position to the upper position when the nozzle is at the retracted position.

A fourth aspect is the substrate processing apparatus according to the third aspect, wherein the control unit has a second control mode in which the nozzle is maintained at an intermediate position when the cup portion is at the upper position, the intermediate position being displaced from the substrate in plan view and being inward of the retracted position.

A fifth aspect is the substrate processing apparatus according to any one of the first to fourth aspects, further including a second container that is capable of accommodating the nozzle at a position different from the retracted position.

A sixth aspect is the substrate processing apparatus according to any one of the first to fifth aspects, wherein the arm actuation mechanism moves the nozzle arm so that the nozzle moves horizontally along a straight line.

A seventh aspect is the substrate processing apparatus according to any one of the first to fifth aspects, wherein the arm actuation mechanism moves the nozzle arm so that the nozzle moves horizontally along an arc.

Effects of the Invention

According to the first aspect, the first container capable of accommodating the nozzle at the retracted position is fixed to the cup portion to be movable up and down integrally with the cup portion, so that operation to raise the cup portion and operation to accommodate the nozzle in the first container can simultaneously and collectively be performed after the nozzle is retracted to the retracted position.

According to the second aspect, the first container overlaps the cup portion in plan view. The area for arrangement of the first container and the cup portion can thereby be reduced.

According to the third aspect, the control unit has the first control mode in which the cup actuation mechanism is controlled to move the cup portion from the lower position to the upper position when the nozzle is at the retracted position. Control for simultaneously and collectively performing operation to raise the cup portion and operation to accommodate the nozzle in the first container can thereby be performed.

According to the fourth aspect, the control unit has the second control mode in which the nozzle is maintained at the intermediate position when the cup portion is at the upper position, the intermediate position being displaced from the substrate in plan view and being inward of the retracted position. Dripping from the nozzle onto the substrate can thereby be avoided by maintaining the nozzle at the intermediate position even in a case where the cup portion at the upper position interferes with movement of the nozzle to the retracted position.

According to the fifth aspect, the substrate processing apparatus includes the second container capable of accommodating the nozzle at the position different from the retracted position. The nozzle can thereby be accommodated at a position other than the position of the first container.

According to the sixth aspect, the arm actuation mechanism moves the nozzle arm so that the nozzle moves horizontally along the straight line. Positional control along a direction of the straight line can thereby be performed with high accuracy.

According to the seventh aspect, the arm actuation mechanism moves the nozzle arm so that the nozzle moves horizontally along the arc. The nozzle can thereby widely be moved using a simple arm actuation mechanism.

BRIEF DESCRIPTION OF DRAWINGS

FIG. 1 is a plan view schematically showing a configuration of a substrate processing system in Embodiment 1 of the present invention.

FIG. 3 is a plan view schematically showing a configuration of a substrate processing apparatus included in the substrate processing system of FIG. 1.

FIG. 4 is a plan view with a nozzle and a portion of a nozzle arm near the nozzle omitted from FIG. 3.

FIG. 6 is a flowchart schematically showing a method of accommodating the nozzle in a container in Embodiment 1 of the present invention.

FIG. 7 is a cross-sectional view schematically showing a state after a step of moving a cup portion from an upper position to a lower position of FIG. 6.

FIG. 14 is a plan view schematically showing a configuration of a substrate processing apparatus in Embodiment 3 of the present invention with the nozzle at the processing position.

DESCRIPTION OF EMBODIMENTS

Embodiments of the present invention will be described below with reference to the drawings. In the following drawings, the same or corresponding parts will bear the same reference signs, and description thereof will not be repeated.

Embodiment 1

FIG. 1 is a plan view schematically showing a configuration of a substrate processing system 100 in Embodiment 1. The substrate processing system 100 includes a load port LP, an indexer robot IR, a center robot CR, a control unit 90 (controller), and at least one processing unit UT (four processing units in FIG. 1). The plurality of processing units UT are for processing a substrate SB (wafer), and at least one of them corresponds to a substrate processing apparatus 101 to be described specifically below. The substrate processing apparatus 101 is an apparatus of single-substrate type that can be used for substrate processing, and is an apparatus of single-substrate type that can be used for processing of removing organic matter adhering to the substrate SB, for example. The substrate processing apparatus 101 may have a chamber 80. In that case, substrate processing can be performed in a desired atmosphere by controlling an atmosphere in the chamber 80.

The control unit 90 can control operation of each unit of the substrate processing system 100. Each of carriers C is a container that accommodates the substrate SB. The load port LP is a container holding mechanism that holds the plurality of carriers C. The indexer robot IR can transport the substrate SB between the load port LP and a substrate placement unit PS. The center robot CR can transport the substrate SB from any one of the substrate placement unit PS and the at least one processing unit UT to another one. With the above-described configuration, the indexer robot IR, the substrate placement unit PS, and the center robot CR function as a transport mechanism that transports the substrate SB between each of the processing units UT and the load port LP.

The substrate SB to be processed is taken out from one of the carriers C by the indexer robot IR and transferred to the center robot CR via the substrate placement unit PS. The center robot CR loads the substrate SB to be processed into the processing unit UT. The processing unit UT performs processing for the substrate SB. The processed substrate SB is taken out from the processing unit UT by the center robot CR, goes through another processing unit UT as necessary, and then is transferred to the indexer robot IR via the substrate placement unit PS. The indexer robot IR loads the processed substrate SB into the carrier C. As described above, the processing for the substrate SB is performed.

Figure 2:
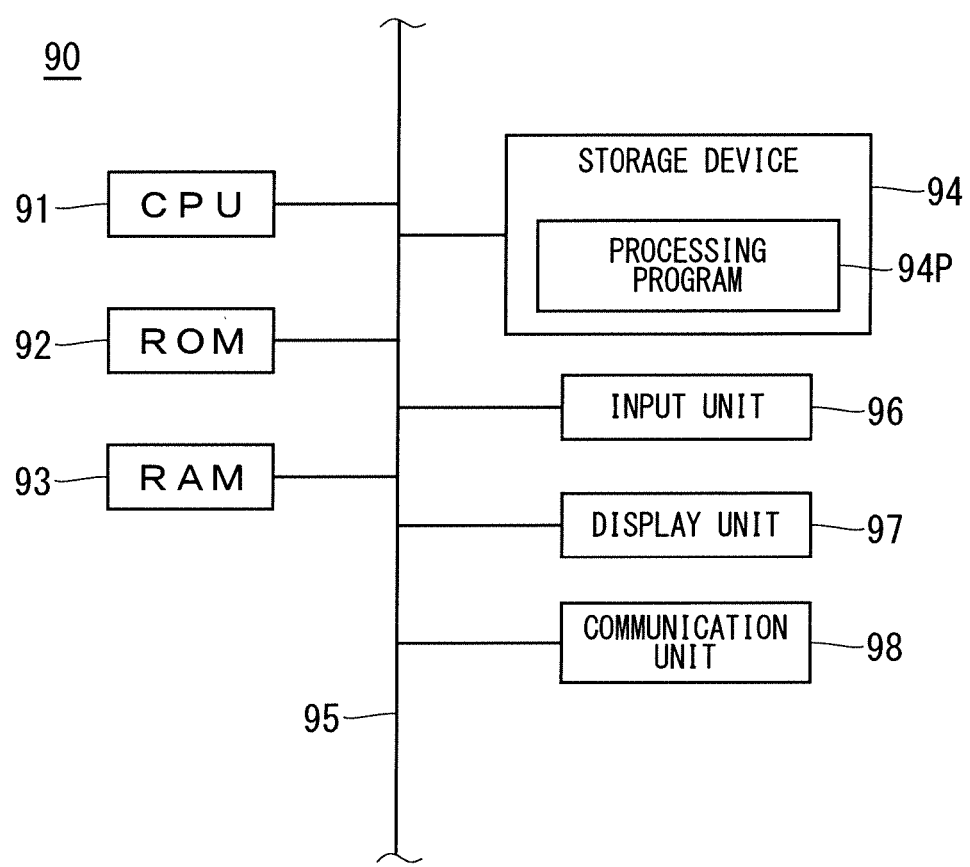
FIG. 2 is a block diagram schematically showing a configuration of a control unit included in the substrate processing system of FIG. 1.

FIG. 2 is a block diagram schematically showing a configuration of the control unit 90 included in the substrate processing system 100 of FIG. 1. The control unit 90 may be configured by a general computer having an electric circuit. Specifically, the control unit 90 includes a central processing unit (CPU) 91, read only memory (ROM) 92, random access memory (RAM) 93, a storage device 94, an input unit 96, a display unit 97, a communication unit 98, and a bus line 95 interconnecting them.

The ROM 92 stores basic programs. The RAM 93 is provided as a work area when the CPU 91 performs predetermined processing. The storage device 94 is configured by a nonvolatile storage device such as flash memory and a hard disk device. The input unit 96 is configured by switches of various types, a touch panel, and the like, and receives input setting instructions such as a processing recipe from an operator. The display unit 97 is configured, for example, by a liquid crystal display, a lamp, and the like, and displays information of various types under the control of the CPU 91. The communication unit 98 has a data communication function using a local area network (LAN) or the like. In the storage device 94, a plurality of modes for controlling each of devices constituting the substrate processing system (FIG. 1) are preset. When the CPU 91 executes a processing program 94P, one of the plurality of modes described above is selected, and each device is controlled according to the mode. The processing program 94P may be stored in a recording medium. When the recording medium is used, the processing program 94P can be installed in the control unit 90. Some or all of the functions executed by the control unit 90 do not necessarily have to be achieved by software and may be achieved by hardware such as a dedicated logic circuit.

Figure 5:
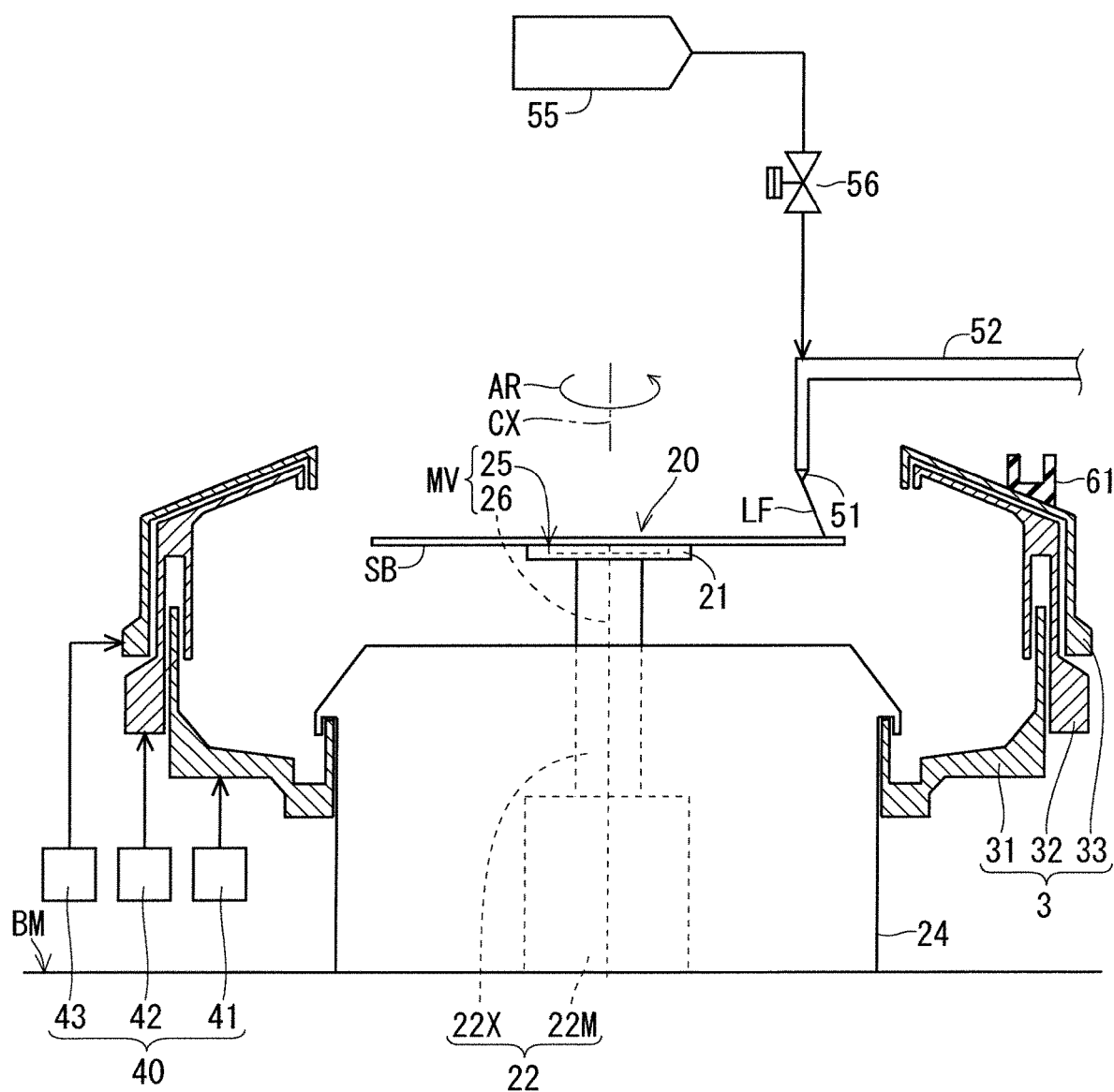
FIG. 5 is a schematic cross-sectional view along the line V-V of FIG. 3 schematically showing a step of discharging a processing liquid from the nozzle to a substrate.

FIG. 3 is a plan view schematically showing a configuration of the substrate processing apparatus 101 included in the substrate processing system 100 (FIG. 1), and FIG. 4 is a plan view with a nozzle 51 and a portion of a nozzle arm 52 near the nozzle 51 omitted from FIG. 3. In each of the drawings, the substrate SB to be processed by the substrate processing apparatus 101 is shown in addition to the substrate processing apparatus 101 for convenience of description. FIG. 5 is a schematic cross-sectional view along the line V-V of FIG. 3 schematically showing a step of discharging a liquid flow LF of a processing liquid from the nozzle 51 to the substrate SB. The substrate processing apparatus 101 is for processing the substrate SB using the processing liquid.

The substrate processing apparatus 101 includes a spin chuck 20, the nozzle 51, the nozzle arm 52, an arm actuation mechanism 53, a cup portion 3, a cup actuation mechanism 40, a first container 61, and a receiving member 24. The spin chuck 20 includes a holding mechanism 21 and a rotation mechanism 22.

The holding mechanism 21 holds the substrate SB horizontally. The rotation mechanism 22 rotates the holding mechanism 21 holding the substrate SB around the axis of rotation CX extending vertically through the center of the substrate SB (see an arrow AR in FIG. 5). The axis of rotation CX is along a vertical direction. The rotation mechanism 22 includes a shaft 22X extending along the axis of rotation CX and a motor 22M that rotates the shaft 22X around the axis of rotation CX. The rotation mechanism 22 is protected by being covered with the receiving member 24.

Specifically, the holding mechanism 21 is a mechanism that can rotate the substrate SB with a main surface to be processed thereof facing upward while holding the substrate SB in a substantially horizontal attitude. The horizontal attitude is herein an attitude in which the thickness of the substrate SB is along the vertical direction. The holding mechanism 21 rotated by the rotation mechanism 22 rotates the substrate SB around the (imaginary) axis of rotation CX extending vertically through the center of the main surface thereof. The axis of rotation CX preferably passes through the center of the substrate SB. The holding mechanism 21 is substantially disc-shaped, for example. The holding mechanism 21 is provided to have a substantially horizontal upper surface and a central axis substantially coincident with the axis of rotation CX. In an example of FIG. 3, the holding mechanism 21 has a smaller diameter than the substrate SB. The shaft 22X that is substantially cylindrical is connected to a lower surface of the holding mechanism 21.

The spin chuck 20 includes a suction mechanism MV. The suction mechanism MV includes a suction hole 25, a suction pipe 26, an on-off valve (not shown), and a pump (not shown). Specifically, the holding mechanism 21 has the suction hole 25 in an upper surface thereof. The suction hole 25 is connected to the pump (not shown) via the suction pipe 26 extending through an internal space of the shaft 22X and the on-off valve (not shown). The pump and the on-off valve are electrically connected to the control unit 90 (FIG. 1). The control unit 90 controls operation of the pump and the on-off valve. The pump can selectively provide a negative pressure and a positive pressure according to control of the control unit 90. When the pump provides the negative pressure with the substrate SB placed on the upper surface of the holding mechanism 21 in the substantially horizontal attitude, the suction hole 25 of the holding mechanism 21 adsorptively holds the substrate SB from below. When the pump provides the positive pressure, the substrate SB can be removed from the upper surface of the holding mechanism 21. In this configuration, the holding mechanism 21 adsorptively holding the substrate SB is rotated by the rotation mechanism 22.

The holding mechanism 21 may have a plurality of mechanical chuck pins arranged at appropriate intervals near the periphery of the upper surface thereof in place of the suction hole 25. The plurality of chuck pins hold the substrate SB. The substrate holding mechanism in this case has the shape of a disc slightly larger than the substrate SB, for example. The plurality of chuck pins removably hold the substrate SB so that the substrate SB is in the substantially horizontal attitude at a position slightly higher than the upper surface of the substrate holding mechanism 21. The chuck pins are each selectively switched between a state of being in contact with the periphery of the substrate SB to hold the substrate SB and a state of being spaced from the periphery of the substrate SB to release the substrate SB by a motor and the like electrically connected to the control unit 90 (FIG. 1).

The nozzle 51 supplies the processing liquid to the substrate SB. Specifically, the nozzle 51 discharges the liquid flow LF of the processing liquid from above the substrate SB toward the substrate SB. The nozzle arm 52 holds the nozzle 51. The arm actuation mechanism 53 is controlled by the control unit 90 (FIG. 1) to move the nozzle arm 52 between a processing position (see FIG. 3) overlapping the substrate SB in plan view and a retracted position (see FIG. 8) displaced from the substrate SB in plan view. Specifically, the arm actuation mechanism 53 moves the nozzle arm 52 so that the nozzle 51 moves horizontally along a straight line (see FIGS. 3 and 8). A direction of extension of the straight line includes a component in a radial direction of the substrate SB, and is preferably along the radial direction.

The processing liquid is supplied from a processing liquid source 55 to the nozzle 51 via a valve 56. The valve 56 is controlled by the control unit 90 (FIG. 1). When the valve 56 is open, the liquid flow LF (FIG. 5) of the processing liquid is discharged from the nozzle 51. The valve 56 and the processing liquid source 55 are not shown in the drawings other than FIG. 5.

The cup portion 3 is disposed around the holding mechanism 21, and receives the processing liquid scattered by centrifugal force from the rotating substrate SB. The cup actuation mechanism 40 is controlled by the control unit 90 to move the cup portion 3 up and down between an upper position (FIG. 5) and a lower position (FIG. 7). The cup actuation mechanism 40 is supported by a chamber bottom BM, and the height of the cup portion 3 from the chamber bottom BM can be changed. When the cup portion 3 is at the upper position, an inner edge of an upper portion of the cup portion 3 is at a position sufficiently higher than the upper surface of the holding mechanism 21 (a support surface of the holding mechanism 21 on which the substrate SB is supported) so that the processing liquid scattered from the substrate SB can sufficiently be received. When the cup portion 3 is at the lower position, the cup portion 3 as a whole is at a position lower than the upper surface of the holding mechanism 21 not to interfere with movement of the substrate SB or the nozzle 51.

Specifically, the cup portion 3 may include a bottom 31, an inner guard 32, and an outer guard 33. An upper portion of each of the inner guard 32 and the outer guard 33 has an inner surface increasing in height with decreasing distance from the substrate SB to efficiently receive the processing liquid scattered from above the substrate SB. As shown in FIG. 5, an inner end of the upper portion of each of the inner guard 32 and the outer guard 33 may have a depending portion for preventing the processing liquid once received by the cup portion 3 from being scattered to the substrate SB again. The cup actuation mechanism 40 may include a bottom actuation mechanism 41, an inner guard actuation mechanism 42, and an outer guard actuation mechanism 43 to respectively move the bottom 31, the inner guard 32, and the outer guard 33 independently of one another, and each of them is configured, for example, by a stepping motor. Each of the inner guard 32 and the outer guard 33 is a tubular member, and is a guard surrounding the holding mechanism 21. The outer guard 33 surrounds the inner guard 32. The outer guard 33 covers an upper surface of the inner guard 32. A single guard or three or more guards may be provided in place of these two guards. The bottom 31 is disposed below the inner guard 32, and receives the processing liquid dropping through the inner guard 32. The bottom 31 may have a vent (not shown) for ejecting the processing liquid. A bottom to receive the processing liquid dropping through a space between the inner guard 32 and the outer guard 33 may further be provided as a modification.

The first container 61 can accommodate the nozzle 51 at the retracted position. The nozzle 51 can perform pre-dispensing or can be cleaned in the first container 61. The first container 61 has an upward-facing opening as shown in FIG. 5. The first container 61 is fixed to the cup portion 3 to be movable up and down integrally with the cup portion 3. When the cup portion 3 is at the lower position (see FIG. 9), the opening of the first container 61 is at a position lower than a lower end of the nozzle 51. When the cup portion 3 is at the upper position (see FIG. 10), the opening of the first container 61 is at a position higher than the lower end of the nozzle 51. In an example of FIG. 5, the first container 61 is attached to an upper surface of the outer guard 33, and thus the first container 61 overlaps the cup portion 3 in plan view (FIG. 4).

FIG. 6 is a flowchart schematically showing a method of accommodating the nozzle 51 in the first container 61 in Embodiment 1.

In step S10 (FIG. 6), the cup portion 3 is moved from the upper position to the lower position. Specifically, arrangement in which the nozzle 51 is at the processing position (see FIG. 3) and the cup portion 3 is at the upper position (see FIG. 5) transitions to arrangement in which the nozzle 51 is at the processing position (see FIG. 3) and the cup portion 3 is at the lower position (see FIG. 7).

Figure 8:
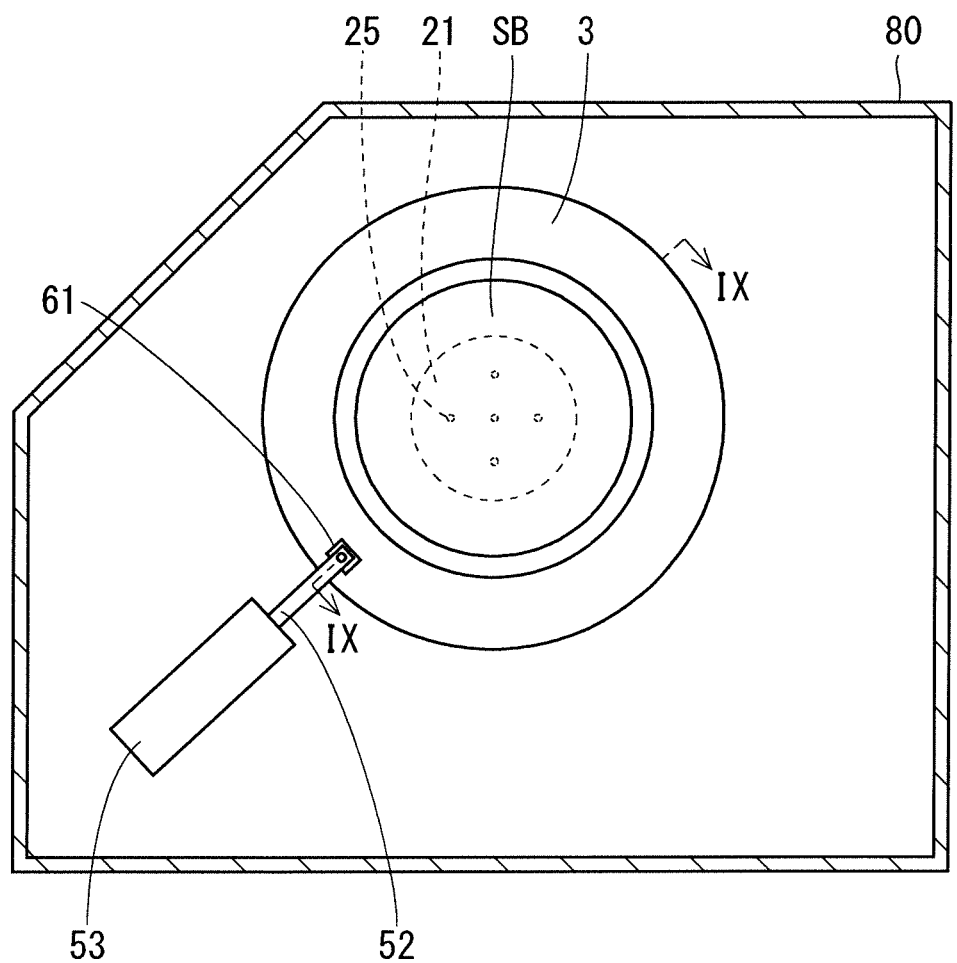
FIG. 8 is a plan view schematically showing a state after a step of moving the nozzle from a processing position to a retracted position of FIG. 6.
Figure 9:
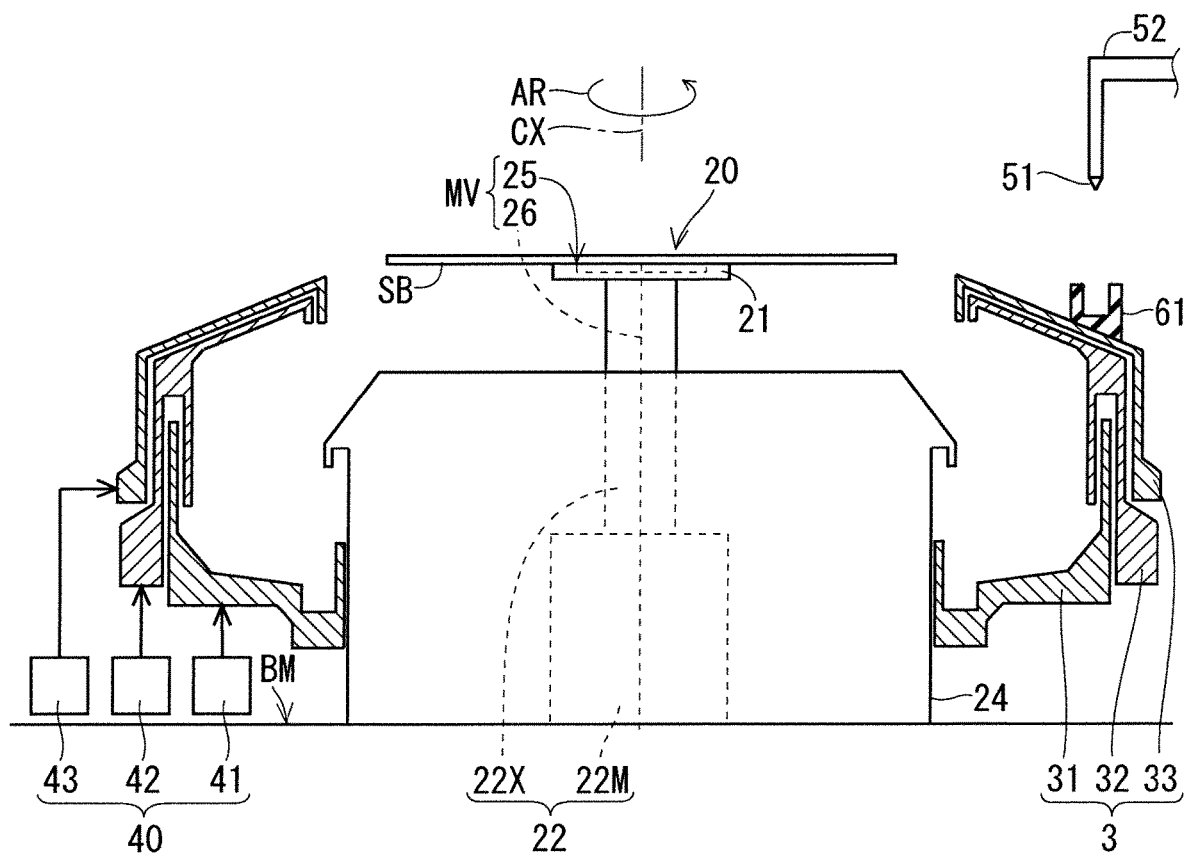
FIG. 9 is a schematic cross-sectional view along the line IX-IX of FIG. 8.

In step S20, the nozzle 51 is moved from the processing position (see FIGS. 3 and 5) to the retracted position (see FIGS. 8 and 9).

Figure 10:
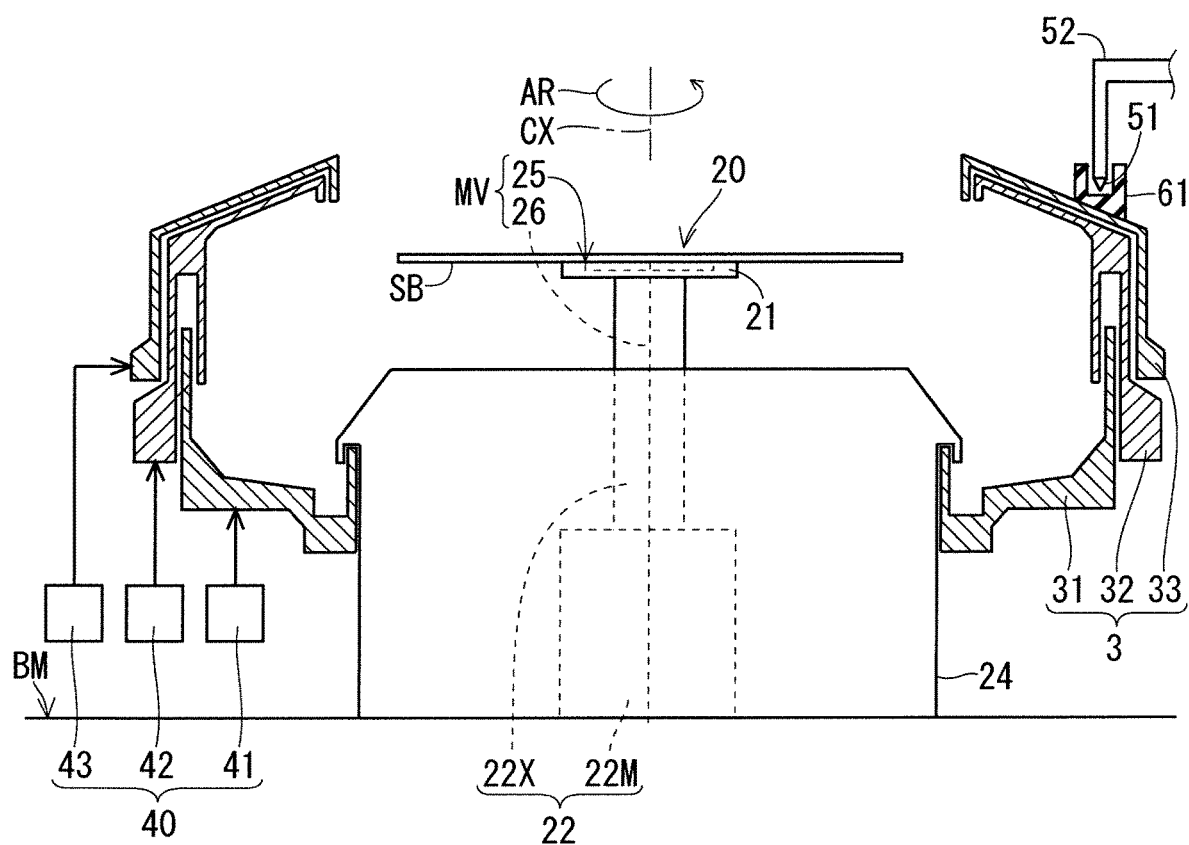
FIG. 10 is a cross-sectional view schematically showing a state after a step of moving the cup portion from the lower position to the upper position of FIG. 6.

In step S30, a first control mode of the control unit 90 (FIG. 1) is executed. Specifically, the cup actuation mechanism 40 (FIG. 5) is controlled to move the cup portion 3 from the lower position to the upper position when the nozzle 51 is at the retracted position as a result of the above-mentioned step S20 (see FIG. 9). As a result, the nozzle 51 is accommodated in the first container 61 as shown in FIG. 10.

According to the present embodiment, the first container 61 that can accommodate the nozzle 51 at the retracted position is fixed to the cup portion 3 to be movable up and down integrally with the cup portion 3, so that operation to raise the cup portion 3 and operation to accommodate the nozzle 51 in the first container 61 can simultaneously and collectively be performed after the nozzle 51 is retracted to the retracted position.

The first container 61 (FIG. 4) overlaps the cup portion 3 in plan view. The area for arrangement of the first container 61 and the cup portion 3 can thereby be reduced.

The control unit 90 (FIG. 1) has the first control mode in which the cup actuation mechanism 40 is controlled to move the cup portion 3 from the lower position to the upper position (see FIG. 10) when the nozzle 51 is at the retracted position (see FIG. 9). Control for simultaneously and collectively performing the operation to raise the cup portion 3 and the operation to accommodate the nozzle 51 in the first container 61 can thereby be performed.

The arm actuation mechanism 53 moves the nozzle arm 52 so that the nozzle 51 moves horizontally long the straight line (see FIGS. 3 and 8). In other words, the arm actuation mechanism 53 is a linear actuator. Positional control along a direction of the straight line can thereby be performed with high accuracy. In particular, in a case where substrate processing only on the periphery of the substrate SB, that is, bevel processing is performed, application of the linear actuator is particularly effective as accuracy of the position of the nozzle 51 in the radial direction of the substrate SB is strictly required. The nozzle 51 for bevel processing typically has an outlet disposed to discharge the liquid flow LF (FIG. 5) of the processing liquid along a direction inclined from the vertical direction. The liquid flow LF is typically discharged downward and outward as shown. In this case, accuracy of not only a horizontal position but also a vertical position of the nozzle 51 is required to accurately manage an objective region on the substrate SB in the radial direction. According to the present embodiment, the nozzle 51 is not required to be moved up and down when the nozzle 51 is accommodated in the first container 61. The position of the nozzle 51 in the vertical direction can thereby accurately be managed as a fixed value. Unintended displacement of the position of the nozzle 51 in the vertical direction can thus be avoided. Accuracy of the position in bevel processing can thereby be increased.

Embodiment 2

Figure 11:
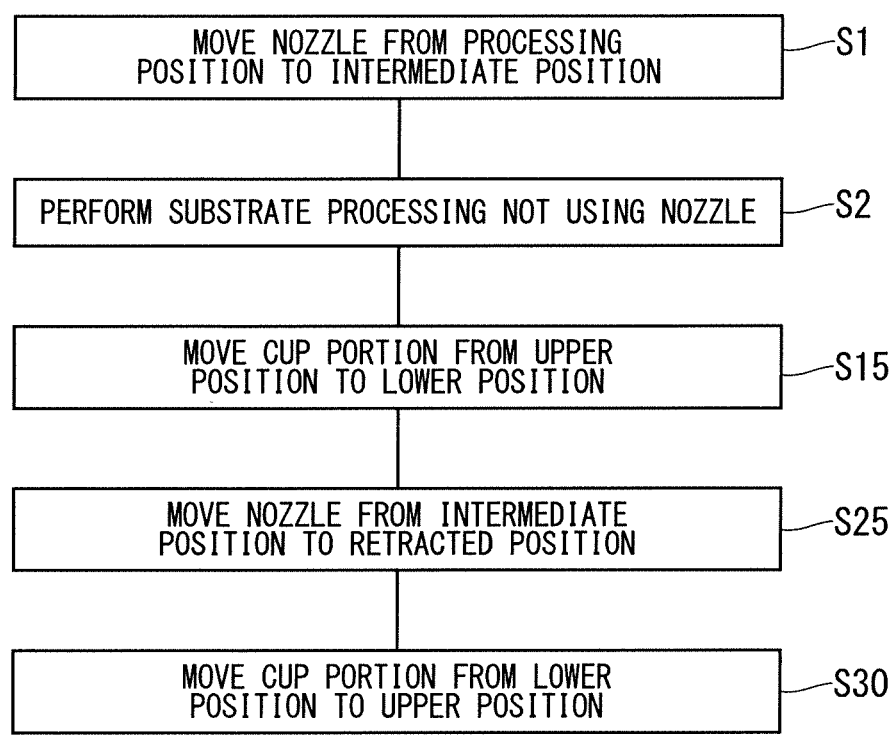
FIG. 11 is a flowchart schematically showing a method of accommodating the nozzle in the container in Embodiment 2 of the present invention.

FIG. 11 is a flowchart schematically showing a method of accommodating the nozzle 51 in the container in Embodiment 2.

Figure 12:
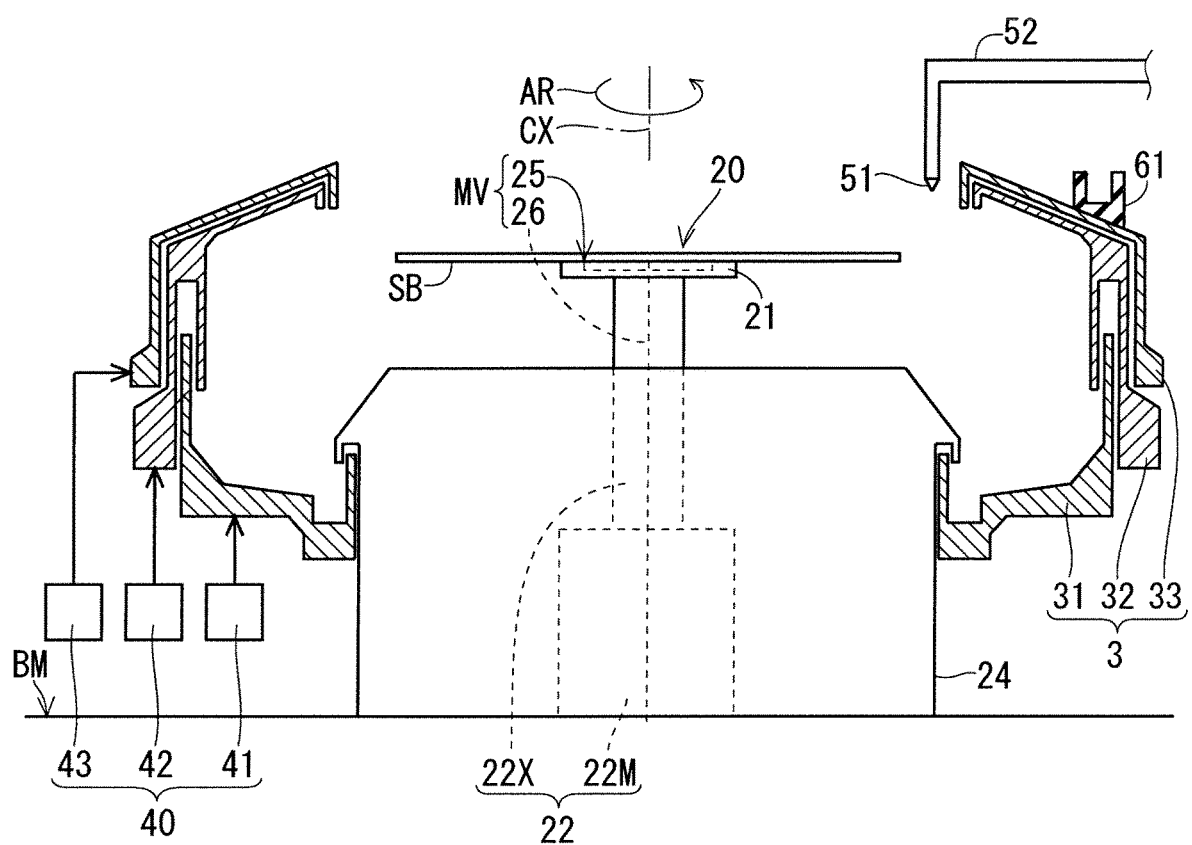
FIG. 12 is a plan view schematically showing a state after a step of moving the nozzle from the processing position to an intermediate position of FIG. 11.

In step S1 (FIG. 11), a second control mode of the control unit 90 (FIG. 1) is executed. Specifically, the control unit 90 controls the arm actuation mechanism 53 so that the nozzle 51 is moved from the processing position to an intermediate position (see FIG. 12) when the cup portion 3 is at the upper position (see FIG. 5). The intermediate position is a position displaced from the substrate SB in plan view and inward of the retracted position (see FIG. 10). The control unit 90 maintains the cup portion 3 at the upper position, and maintains the nozzle 51 at the intermediate position.

In step S2 (FIG. 11), any substrate processing not using the nozzle 51 is performed while arrangement in the above-mentioned step S1 is maintained. Processing to rotate the substrate SB to remove the processing liquid adhering to the substrate SB, that is, substrate drying processing is typically performed.

Figure 13:
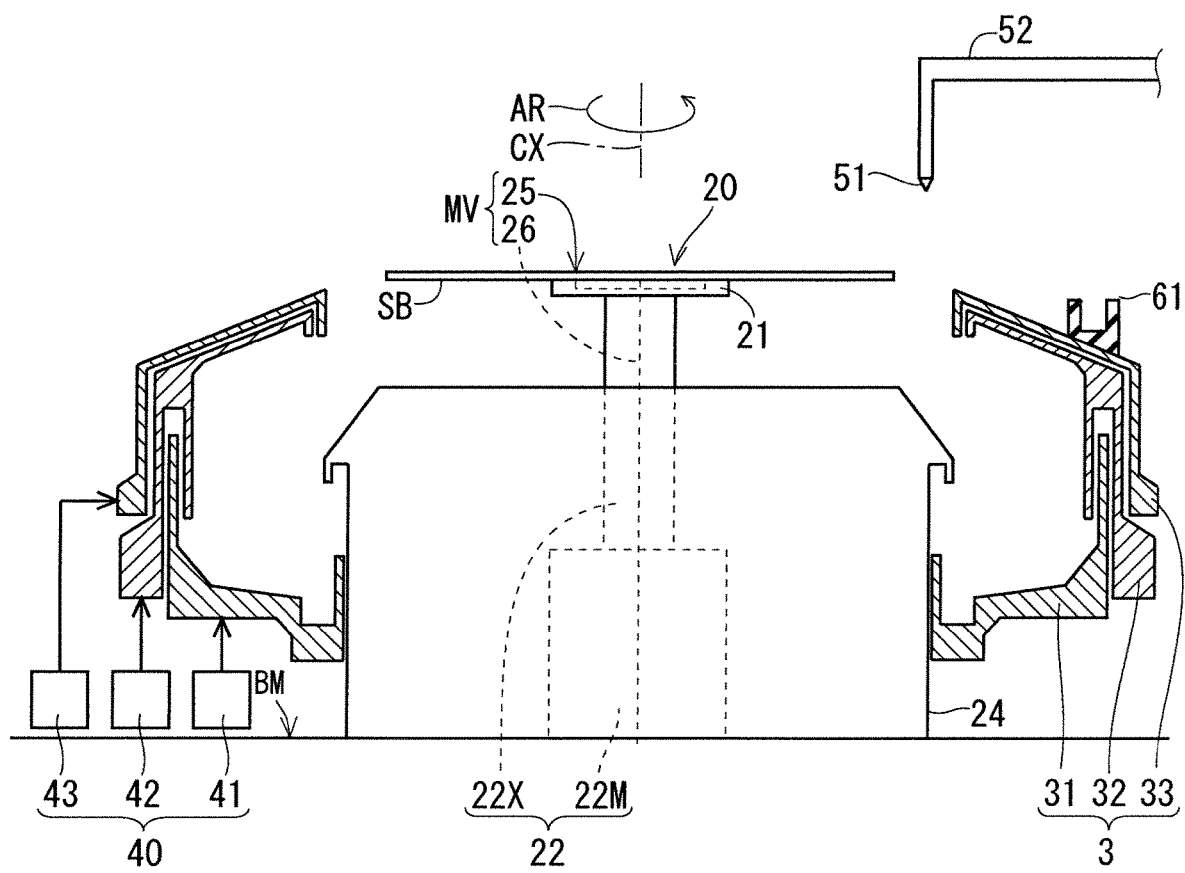
FIG. 13 is a cross-sectional view schematically showing a state after a step of moving the cup portion from the upper position to the lower position of FIG. 11.

In step S15 (FIG. 11), the cup portion 3 is moved from the upper position (see FIG. 12) to the lower position (see FIG. 13). In step S25 (FIG. 11), the nozzle 51 is moved from the intermediate position (see FIG. 13) to the retracted position (see FIG. 9). The step S30 (FIG. 11) is then performed as in Embodiment 1 described above (see FIG. 10).

Embodiment 2 is similar to Embodiment 1 described above except that the control unit 90 has the second control mode.

According to the present embodiment, the nozzle 51 is maintained at the intermediate position when the cup portion 3 is at the upper position in the second control mode. Dripping from the nozzle 51 onto the substrate SB can thereby be avoided by maintaining the nozzle 51 at the intermediate position even in a case where the cup portion 3 at the upper position interferes with movement of the nozzle 51 to the retracted position.

Embodiment 3

Figure 15:
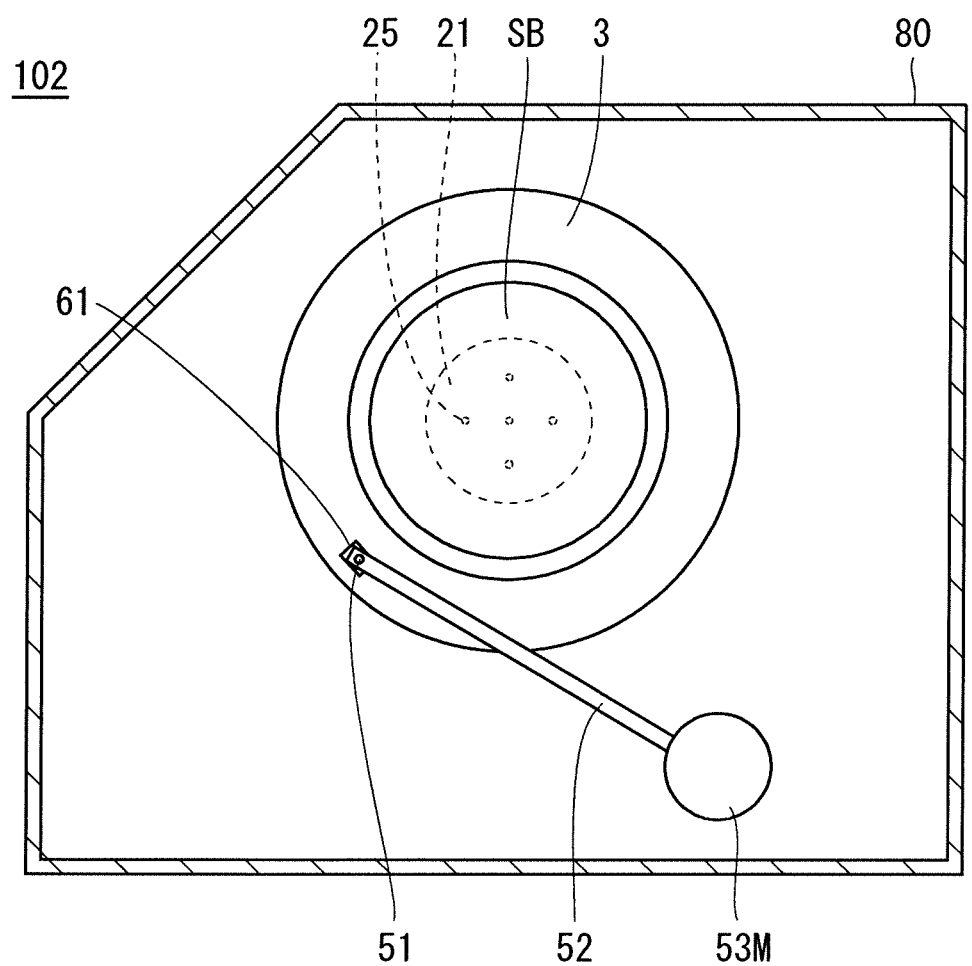
FIG. 15 is a plan view schematically showing a configuration of the substrate processing apparatus of FIG. 14 with the nozzle at the retracted position.

FIGS. 14 and 15 are plan views each schematically showing a configuration of a substrate processing apparatus 102 in Embodiment 3 with the nozzle 51 at the processing position and the retracted position. The substrate processing apparatus 102 includes an arm actuation mechanism 53M in place of the arm actuation mechanism 53 (FIG. 3: Embodiment 1). The arm actuation mechanism 53M moves the nozzle arm 52 so that the nozzle 51 moves horizontally along an arc. The arm actuation mechanism 53M may not only move the nozzle 51 horizontally as described above but also move the nozzle 51 vertically.

Embodiment 3 is otherwise similar to Embodiment 1 or 2 described above.

According to the present embodiment, the arm actuation mechanism 53M moves the nozzle arm 52 so that the nozzle 51 moves horizontally along the arc as described above. The nozzle 51 can thereby widely be moved using a simple arm actuation mechanism.

Embodiment 4

Figure 16:
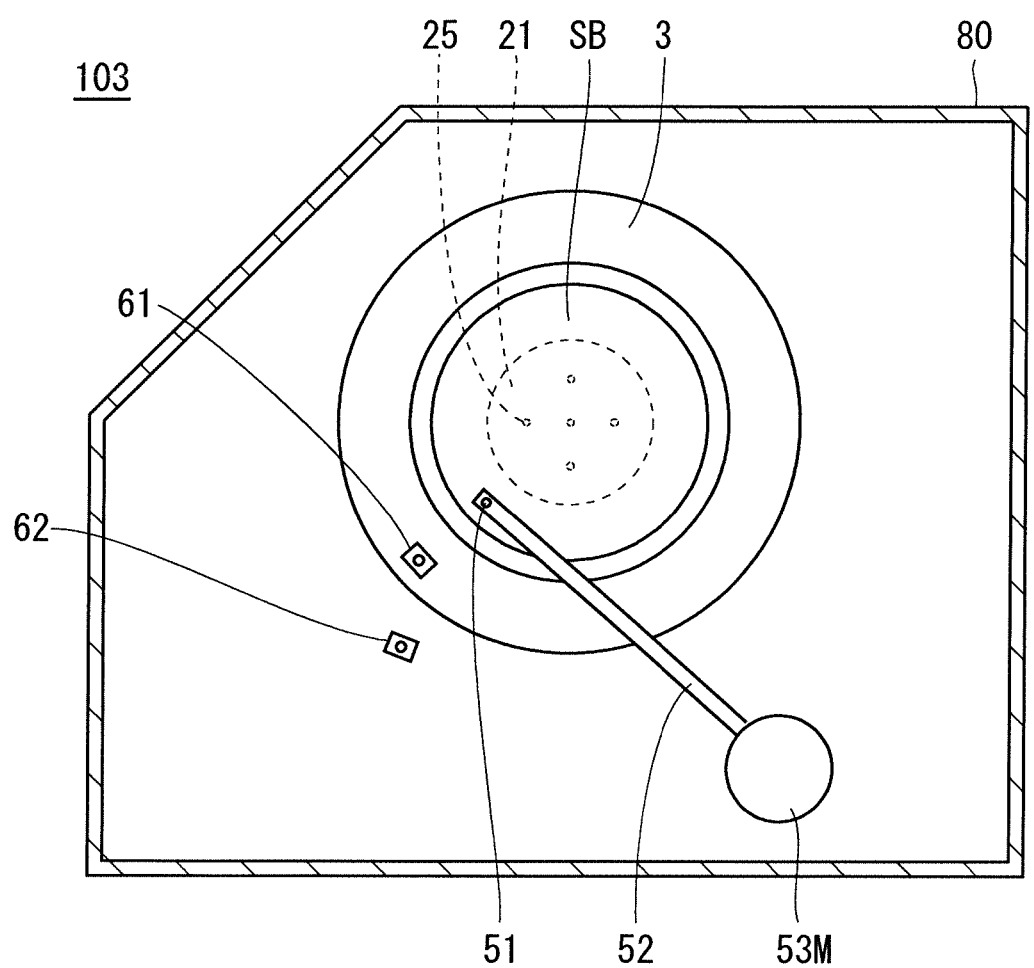
FIG. 16 is a plan view schematically showing a configuration of a substrate processing apparatus in Embodiment 4 of the present invention.

FIG. 16 is a plan view schematically showing a configuration of a substrate processing apparatus 103 in Embodiment 4. The substrate processing apparatus 103 includes a second container 62 in addition to the configuration of the substrate processing apparatus 102 (FIG. 14: Embodiment 3). The second container 62 can accommodate the nozzle 51 at a position different from the retracted position. The nozzle 51 can thereby be accommodated at a position other than the position of the first container 61. In the shown configuration, the second container 62 is disposed outward of the cup portion 3 to be spaced from the cup portion 3. In contrast to the first container 61, the second container 62 may not be movable up and down integrally with the cup portion 3. The second container 62 may be disposed inward of the cup portion 3 to be spaced from the cup portion 3 as a modification.

Embodiment 4 is otherwise similar to Embodiment 3 described above. The second container 62 may be applied to Embodiment 1 or 2 described above as a modification.

Embodiment 5

Figure 17:
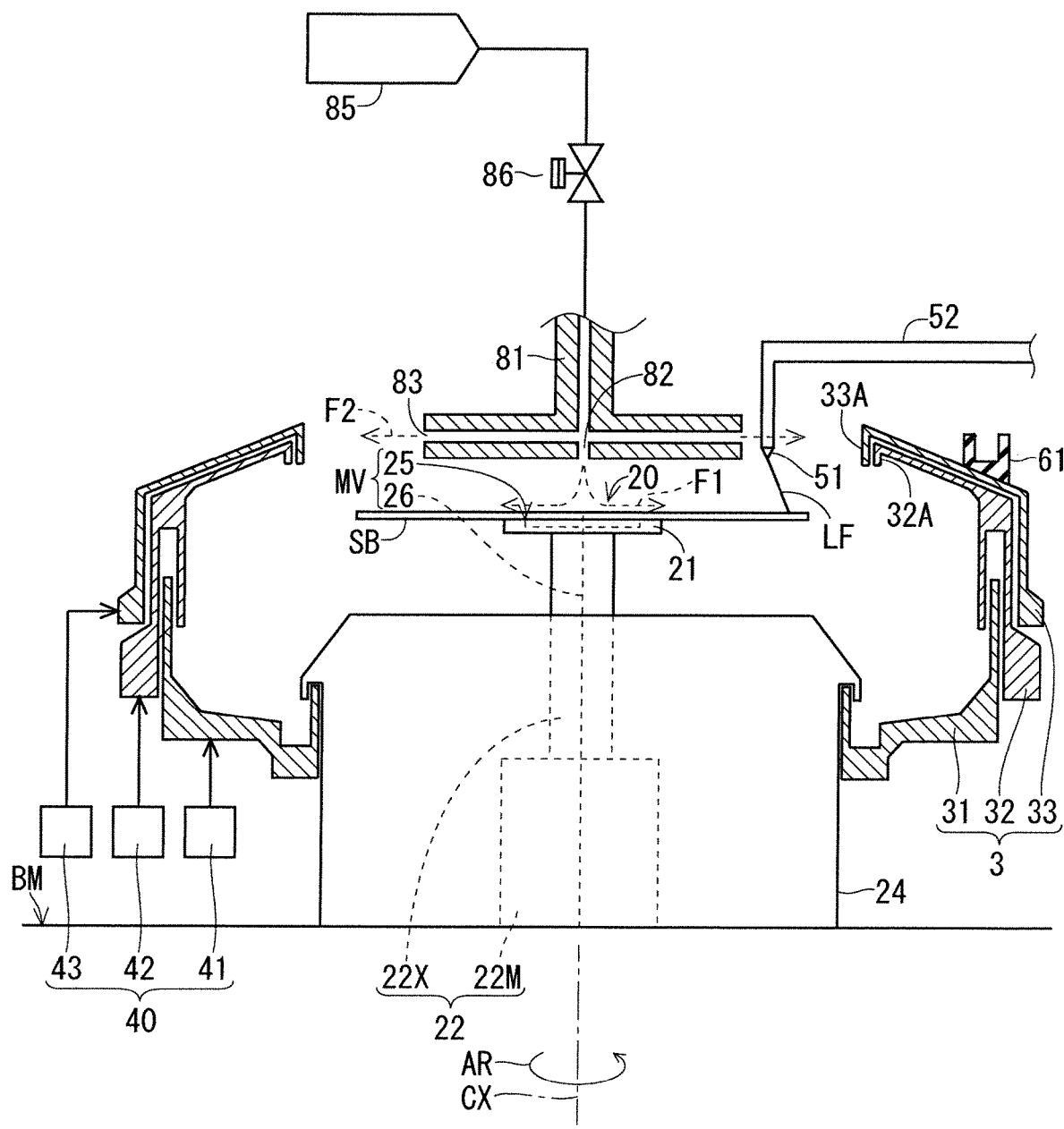
FIG. 17 is a cross-sectional view schematically showing a configuration of a substrate processing apparatus in Embodiment 5 of the present invention.

FIG. 17 is a cross-sectional view schematically showing a configuration of a substrate processing apparatus 104 in Embodiment 5. The substrate processing apparatus 104 is for bevel processing. The substrate processing apparatus 104 includes a gas nozzle 81, a valve 86, and a gas source 85 in addition to the configuration of the substrate processing apparatus 101 (FIG. 5: Embodiment 1). An outer edge of the gas nozzle 81 has a circular shape. The circular shape of the gas nozzle 81 has a smaller radius than the substrate SB.

The gas nozzle 81 is supplied with gas from the gas source 85 via the valve 86. The gas source 85 may be an inert gas source, and is a nitrogen gas source, for example. The valve 86 is controlled by the control unit 90 (FIG. 1). The gas nozzle 81 has a downward-facing opening 82 and an outward-facing opening 83. When the valve 86 is open, a gas flow F1 and a gas flow F2 are discharged respectively from the opening 82 and the opening 83. The gas flow F1 prevents unintended ingress of the processing liquid into the vicinity of the center of the substrate SB. The gas flow F2 suppresses access of the processing liquid rebounding from the cup portion 3 to the substrate SB. The gas flow F2 is preferably displaced from the outlet of the nozzle 51 and a position immediately below the outlet of the nozzle 51. This prevents the gas flow F2 from disturbing a direction of travel of the liquid flow LF of the processing liquid.

In the present embodiment and the other embodiments, the inner guard 32 and the outer guard 33 preferably have a depending portion 32A and a depending portion 33A, respectively. The depending portion 32A and the depending portion 33A extend downward respectively from an inner end of an upper portion of the inner guard 32 and an inner end of an upper portion of the outer guard 33. The depending portion 32A and the depending portion 33A have effects of preventing the processing liquid received respectively by the inner guard 32 and the outer guard 33 from returning to the substrate SB. On the other hand, the depending portion 32A and the depending portion 33A are likely to reflect the processing liquid from the substrate SB to the substrate SB, which is not desirable. A portion of the inner end of the upper portion of the inner guard 32 and a portion of the inner end of the upper portion of the outer guard 33 closest to the nozzle 51 in plan view (see FIG. 3) preferably do not have the depending portion 32A and the depending portion 33A, respectively. In this case, the processing liquid received by the inner guard 32 and the outer guard 33 is likely to return to the substrate SB near the processing position of the nozzle 51. The return can be suppressed by the above-mentioned gas flow F2.

The return of the processing liquid from the cup portion 3 to the substrate SB, however, cannot sufficiently be prevented only by action of the gas flow F2 in some cases. The circular shape of the gas nozzle 81 thus preferably has a radius equal to or greater than two-thirds of the radius of the substrate SB. In this case, a wide region from the center to the periphery of the substrate SB is covered with the gas nozzle 81, and is protected from the processing liquid rebounding from the cup portion 3.

The other configuration is substantially the same as that in Embodiment 1 described above, so that the same or corresponding parts will bear the same reference signs, and description thereof will not be repeated.

While the present invention has been described in detail, the foregoing description is in all aspects illustrative and not restrictive. It is understood that numerous unillustrated modifications can be devised without departing from the scope of the present invention. Configurations described in the above-mentioned embodiments and modifications can be combined with each other, or omitted as appropriate unless any contradiction occurs.

EXPLANATION OF REFERENCE SIGNS

3: cup portion
20: spin chuck
21: holding mechanism
22: rotation mechanism
22M: motor
22X: shaft
24: receiving member
25: suction hole
26: suction pipe
31: bottom
32: inner guard
32A, 33A: depending portion
33: outer guard
40: cup actuation mechanism
41: bottom actuation mechanism
42: inner guard actuation mechanism
43: outer guard actuation mechanism
51: nozzle
52: nozzle arm
53, 53M: arm actuation mechanism
55: processing liquid source
56: valve
61: first container
62: second container
81: gas nozzle
82, 83: opening
85: gas source
86: valve
90: control unit
100: substrate processing system
101-104: substrate processing apparatus
SB: substrate

The invention claimed is:

1. A substrate processing apparatus for processing a substrate using a processing liquid, the substrate processing apparatus comprising:
    a holder that holds the substrate horizontally;
    a rotator that rotates the holder holding the substrate;
    a nozzle that supplies the processing liquid to the substrate;
    a nozzle arm that holds the nozzle;
    an arm actuator that moves the nozzle arm between a processing position overlapping the substrate in plan view and a retracted position displaced from the substrate in plan view;
    a cup portion that is disposed around the holder, and receives the processing liquid from the substrate;
    a cup actuator that moves the cup portion up and down between an upper position and a lower position;
    a first container that is fixed to the cup portion to be movable up and down integrally with the cup portion, and is capable of accommodating the nozzle at the retracted position; and
    a controller that is configured to have a first control mode in which the cup actuator is controlled to move the cup portion from the lower position to the upper position when the nozzle is at the retracted position,
    wherein the upper position is set so that an upper surface of the first container is above a tip of the nozzle when the cup portion is moved to the upper position in the first control mode.

2. The substrate processing apparatus according to claim 1, wherein
    the first container overlaps the cup portion in plan view.

3. The substrate processing apparatus according to claim 1, wherein
    the controller that is configured to have a second control mode in which the nozzle is maintained at an intermediate position when the cup portion is at the upper position, the intermediate position being displaced from the substrate in plan view and being inward of the retracted position.

4. The substrate processing apparatus according to claim 1, further comprising
    a second container that is capable of accommodating the nozzle at a position different from the retracted position.

5. The substrate processing apparatus according to claim 1, wherein
    the arm actuator moves the nozzle arm so that the nozzle moves horizontally along a straight line.

6. The substrate processing apparatus according to claim 1, wherein the arm actuator moves the nozzle arm so that the nozzle moves horizontally along an arc.

* * * * *